US008679987B2

(12) United States Patent
Reilly et al.

(10) Patent No.: US 8,679,987 B2
(45) Date of Patent: Mar. 25, 2014

(54) DEPOSITION OF AN AMORPHOUS CARBON LAYER WITH HIGH FILM DENSITY AND HIGH ETCH SELECTIVITY

(75) Inventors: Patrick Reilly, Dublin, CA (US);
Shahid Shaikh, Santa Clara, CA (US);
Tersem Summan, San Jose, CA (US);
Deenesh Padhi, Sunnyvale, CA (US);
Sanjeev Baluja, Campbell, CA (US);
Juan Carlos Rocha-Alvarez, San Carlos, CA (US); Thomas Nowak, Cupertino, CA (US); Bok Hoen Kim, San Jose, CA (US); Derek R. Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 125 days.

(21) Appl. No.: 13/468,776

(22) Filed: May 10, 2012

(65) Prior Publication Data

US 2013/0302996 A1 Nov. 14, 2013

(51) Int. Cl.
*H01L 21/47* (2006.01)
*H01L 21/312* (2006.01)

(52) U.S. Cl.
USPC ............. 438/781; 257/E21.242; 257/E21.024

(58) Field of Classification Search
USPC ........................................................ 438/781
See application file for complete search history.

(56) References Cited

U.S. PATENT DOCUMENTS

| | | | |
|---|---|---|---|
| 6,214,637 B1 * | 4/2001 | Kim et al. | 438/72 |
| 6,428,894 B1 * | 8/2002 | Babich et al. | 428/408 |
| 6,573,030 B1 * | 6/2003 | Fairbairn et al. | 430/323 |
| 7,094,442 B2 | 8/2006 | Seamons et al. | |
| 7,109,098 B1 | 9/2006 | Ramaswamy et al. | |
| 7,312,162 B2 * | 12/2007 | Ramaswamy et al. | 438/758 |
| 7,332,262 B2 * | 2/2008 | Latchford et al. | 430/311 |
| 7,455,824 B2 | 11/2008 | Nakanishi et al. | |
| 7,820,293 B2 | 10/2010 | Dekempeneer | |
| 7,867,578 B2 * | 1/2011 | Padhi et al. | 427/569 |
| 7,906,817 B1 | 3/2011 | Wu et al. | |
| 8,361,906 B2 * | 1/2013 | Lee et al. | 438/725 |
| 2002/0015521 A1 | 2/2002 | Kim | |
| 2003/0091938 A1 * | 5/2003 | Fairbairn et al. | 430/314 |
| 2004/0074260 A1 | 4/2004 | Veerasamy | |

(Continued)

FOREIGN PATENT DOCUMENTS

KR 10-2000-0067643 11/2000
KR 10-2007-0035200 3/2007

OTHER PUBLICATIONS

International Search Report and Written Opinion of the International Searching Authority mailed Jun. 26, 2013 in PCT/US2013/035827.

*Primary Examiner* — David Vu
*Assistant Examiner* — Earl Taylor
(74) *Attorney, Agent, or Firm* — Patterson & Sheridan, LLP

(57) ABSTRACT

Embodiments described herein relate to a method for processing a substrate. In one embodiment, the method includes introducing a gas mixture comprising a hydrocarbon source and a diluent gas into a deposition chamber located within a processing system, generating a plasma from the gas mixture in the deposition chamber at a temperature between about 200° C. and about 700° C. to form a low-hydrogen content amorphous carbon layer on the substrate, transferring the substrate into a curing chamber located within the processing system without breaking vacuum, and exposing the substrate to UV radiation within the curing chamber at a curing temperature above about 200° C.

20 Claims, 5 Drawing Sheets

(56) References Cited

U.S. PATENT DOCUMENTS

| | | |
|---|---|---|
| 2005/0142361 A1* | 6/2005 | Nakanishi et al. ............. 428/408 |
| 2005/0199013 A1* | 9/2005 | Vandroux et al. ............... 65/386 |
| 2006/0014397 A1* | 1/2006 | Seamons et al. .............. 438/778 |
| 2007/0286954 A1* | 12/2007 | Tang et al. ................. 427/249.1 |
| 2008/0153311 A1* | 6/2008 | Padhi et al. ................... 438/780 |
| 2008/0191598 A1 | 8/2008 | Yang et al. |
| 2008/0254233 A1* | 10/2008 | Lee et al. ....................... 427/595 |
| 2008/0293248 A1* | 11/2008 | Park et al. ..................... 438/694 |
| 2009/0093128 A1* | 4/2009 | Seamons et al. .............. 438/778 |
| 2010/0093187 A1* | 4/2010 | Lee et al. ....................... 438/780 |
| 2010/0119732 A1 | 5/2010 | Creatore et al. |
| 2010/0310863 A1* | 12/2010 | Kuchiyama et al. .......... 428/336 |
| 2011/0287633 A1* | 11/2011 | Lee et al. ....................... 438/725 |
| 2012/0015521 A1* | 1/2012 | Yu et al. ........................ 438/703 |
| 2012/0090691 A1* | 4/2012 | Baluja et al. .................... 137/13 |

* cited by examiner

FIG. 3A
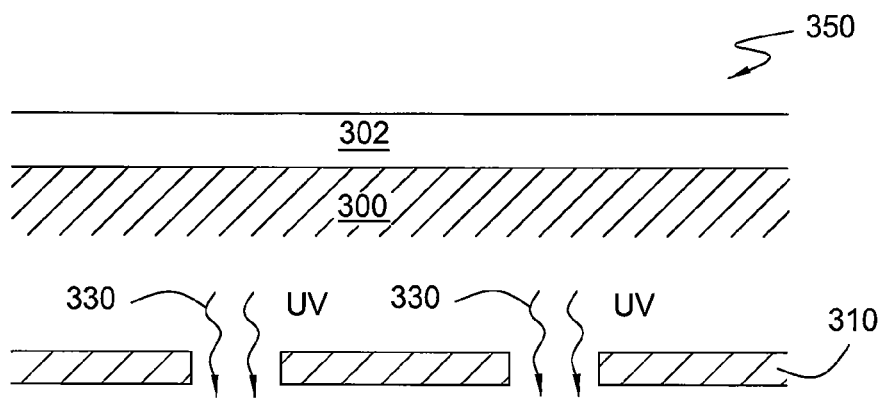
FIG. 3B
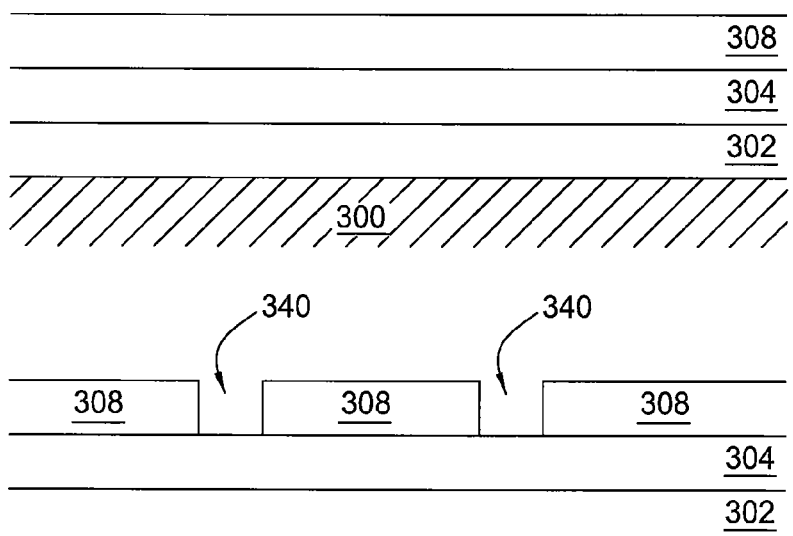
FIG. 3C
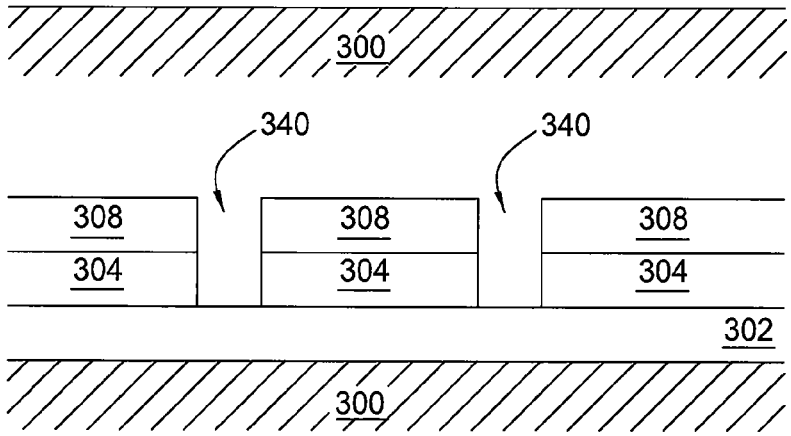
FIG. 3D
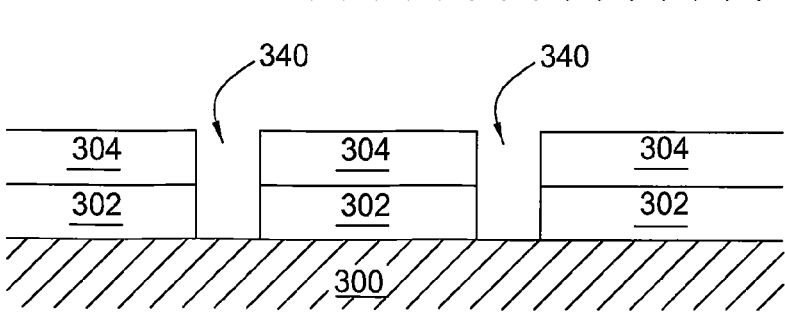
FIG. 3E

"A"

"B"

DEPOSITION OF AN AMORPHOUS CARBON LAYER WITH HIGH FILM DENSITY AND HIGH ETCH SELECTIVITY

BACKGROUND OF THE INVENTION

1. Field

Embodiments of the present invention generally relate to the fabrication of integrated circuits and particularly to the deposition of an amorphous carbon layer with high film density and high etch selectivity.

2. Description of the Related Art

Carbon-based materials, such as amorphous carbon (denoted as a-C), has been proved to be an effective material serving as etch hardmask for oxide, nitride, poly-Si, or metal (e.g., Al) materials due to its chemical inertness, optical transparency, and good mechanical properties.

To ensure that the desired amorphous carbon film adequately protects underlying material layer during the subsequent etching process, it is important that amorphous carbon film possesses a relatively high etch selectivity, or removal rate ratio, with respect to material layer thereunder. Higher etch selectivity is required to transfer the patterns to underlayers accurately. The etch selectivity can be increased by, for example, densifying the amorphous carbon film, which, however, results in high compressive film stress that may significantly impact the feature transfer during the lithographic process. High compressive film stress induces patterned line bending or line breakage during the subsequent etching process, especially when the feature size shrinks to 20 nm and beyond.

Therefore, there is a need in the art for a hardmask with reduced compressive film stress, excellent etch selectivity and line bending control.

SUMMARY

Embodiments of the present invention generally provide a method for forming a hard mask with high film density, high etch selectivity, and decent ashability, while still maintaining a superior line integrity for sub 45 nm devices. High etch selectivity enables a thinner hardmask which improves etch margin and allows for controllable etch of smaller features without having conventional issues associated with line wiggling and line bending.

Embodiments of the present invention provide a method for depositing an amorphous carbon layer on a substrate in a substrate processing chamber. In one embodiment, the method includes introducing a gas mixture comprising a hydrocarbon source and a diluent gas into a deposition chamber located within a processing system, generating a plasma from the gas mixture in the deposition chamber at a temperature between about 200° C. and about 700° C. to form a low-hydrogen content amorphous carbon layer on the substrate, transferring the substrate into a curing chamber located within the processing system without breaking vacuum, and exposing the substrate to UV radiation within the curing chamber at a curing temperature above about 200° C.

Embodiments of the present invention also provide a method for forming a semiconductor device in a processing chamber. In one embodiment, the method includes forming an amorphous carbon layer on a substrate in a deposition chamber located within a processing system by introducing a gas mixture comprising a hydrocarbon source and a diluent gas into the deposition chamber, and generating a plasma from the gas mixture in the deposition chamber at a temperature between about 200° C. and about 700° C. to form a low-hydrogen content amorphous carbon layer on the substrate, transferring the substrate into a curing chamber located within the processing system without breaking vacuum, exposing the amorphous carbon layer formed on the substrate to UV radiation within the curing chamber at a curing temperature above about 200° C., defining a pattern in at least one region of the amorphous carbon layer, and transferring the pattern defined in the at least one region of the amorphous carbon layer into the substrate using the amorphous carbon layer as a mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3E illustrate schematic cross-sectional views of a substrate at different stages of an integrated circuit fabrication sequence incorporating an amorphous carbon layer as a hardmask.

DETAILED DESCRIPTION

Exemplary Hardware for Deposition Process

Figure 1:
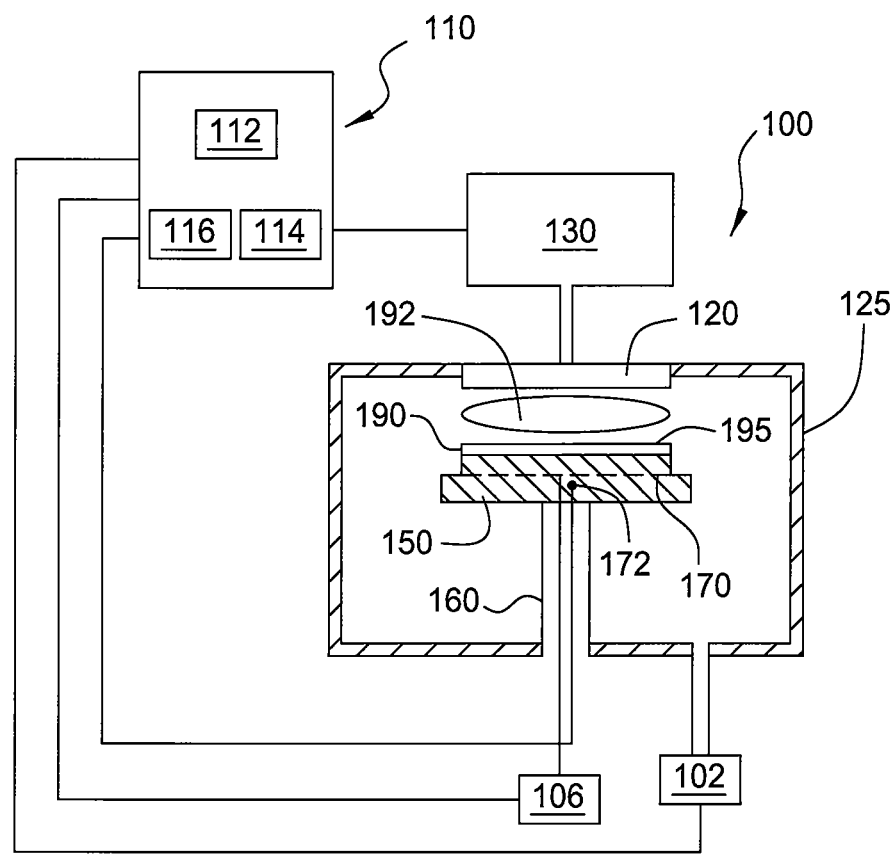
FIG. 1 is a schematic representation of a substrate processing system that can be used for depositing an amorphous carbon layer according to embodiments of the invention.

FIG. 1 is a schematic representation of a substrate processing system 100, which can be used for amorphous carbon layer deposition according to embodiments described herein. Examples of suitable chamber include the CENTURA® systems which may use a DxZ™ process chamber, PRECISION 5000® systems, PRODUCER™ systems, such as the PRODUCER SE™ process chamber and the PRODUCER GT™ process chamber, all of which are commercially available from Applied Materials, Inc., of Santa Clara, Calif. It is contemplated that the processes described herein may be performed on other substrate processing systems, including those from other manufacturers.

System 100 includes a process chamber 125, a gas panel 130, a control unit 110, and other hardware components such as power supplies and vacuum pumps. Further details of one embodiment of the system used in the embodiments described herein are described in a commonly assigned U.S. patent "High Temperature Chemical Vapor Deposition Chamber", U.S. Pat. No. 6,364,954, issued on Apr. 2, 2002.

The process chamber 125 generally comprises a substrate support pedestal 150, which is used to support a substrate such as a semiconductor substrate 190. This substrate support pedestal 150 moves in a vertical direction inside the process chamber 125 using a displacement mechanism (not shown) coupled to shaft 160. Depending on the process, the semiconductor substrate 190 can be heated to a desired temperature prior to processing. The substrate support pedestal 150 is heated by an embedded heater element 170. For example, the substrate support pedestal 150 may be resistively heated by applying an electric current from a power supply 106 to the heater element 170. A temperature sensor 172, such as a thermocouple, is also embedded in the substrate support pedestal 150 to monitor the temperature of the substrate support pedestal 150. The measured temperature is used in a feedback loop to control the power supply 106 for the heater element 170.

A vacuum pump 102 is used to evacuate the process chamber 125 and to maintain the proper gas flows and pressure inside the process chamber 125. A showerhead 120, through which process gases are introduced into process chamber 125, is located above the substrate support pedestal 150 and is adapted to provide a uniform distribution of process gases into the process chamber 125. The showerhead 120 is connected to a gas panel 130, which controls and supplies the various process gases used in different steps of the process sequence. Process gases may include a hydrocarbon source, a diluent source gas such as hydrogen, and optionally, a plasma-initiating gas and are described in more detail below in conjunction with a description of an exemplary amorphous carbon layer deposition process.

The gas panel 130 may also be used to control and supply various vaporized liquid precursors. While not shown, liquid precursors from a liquid precursor supply may be vaporized, for example, by a liquid injection vaporizer, and delivered to the process chamber 125 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 120 and substrate support pedestal 150 may also form a pair of spaced electrodes. When an electric field is generated between these electrodes, the process gases introduced into chamber 125 are ignited into a plasma 192. Typically, the electric field is generated by connecting the substrate support pedestal 150 to a source of single-frequency or dual-frequency radio frequency (RF) power (not shown) through a matching network (not shown). Alternatively, the RF power source and matching network may be coupled to the showerhead 120, or coupled to both the showerhead 120 and the substrate support pedestal 150.

Proper control and regulation of the gas and liquid flows through the gas panel 130 is performed by mass flow controllers (not shown) and a control unit 110 such as a computer. The showerhead 120 allows process gases from the gas panel 130 to be uniformly distributed and introduced into the process chamber 125. Illustratively, the control unit 110 comprises a central processing unit (CPU) 112, support circuitry 114, and memories containing associated control software 116. When the process gas mixture exits the showerhead 120, plasma enhanced thermal decomposition of the hydrocarbon compound occurs at the surface 195 of the semiconductor substrate 190, resulting in the deposition of an amorphous carbon layer on the semiconductor substrate 190.

Exemplary Hardware for UV Curing Process

Figure 2:
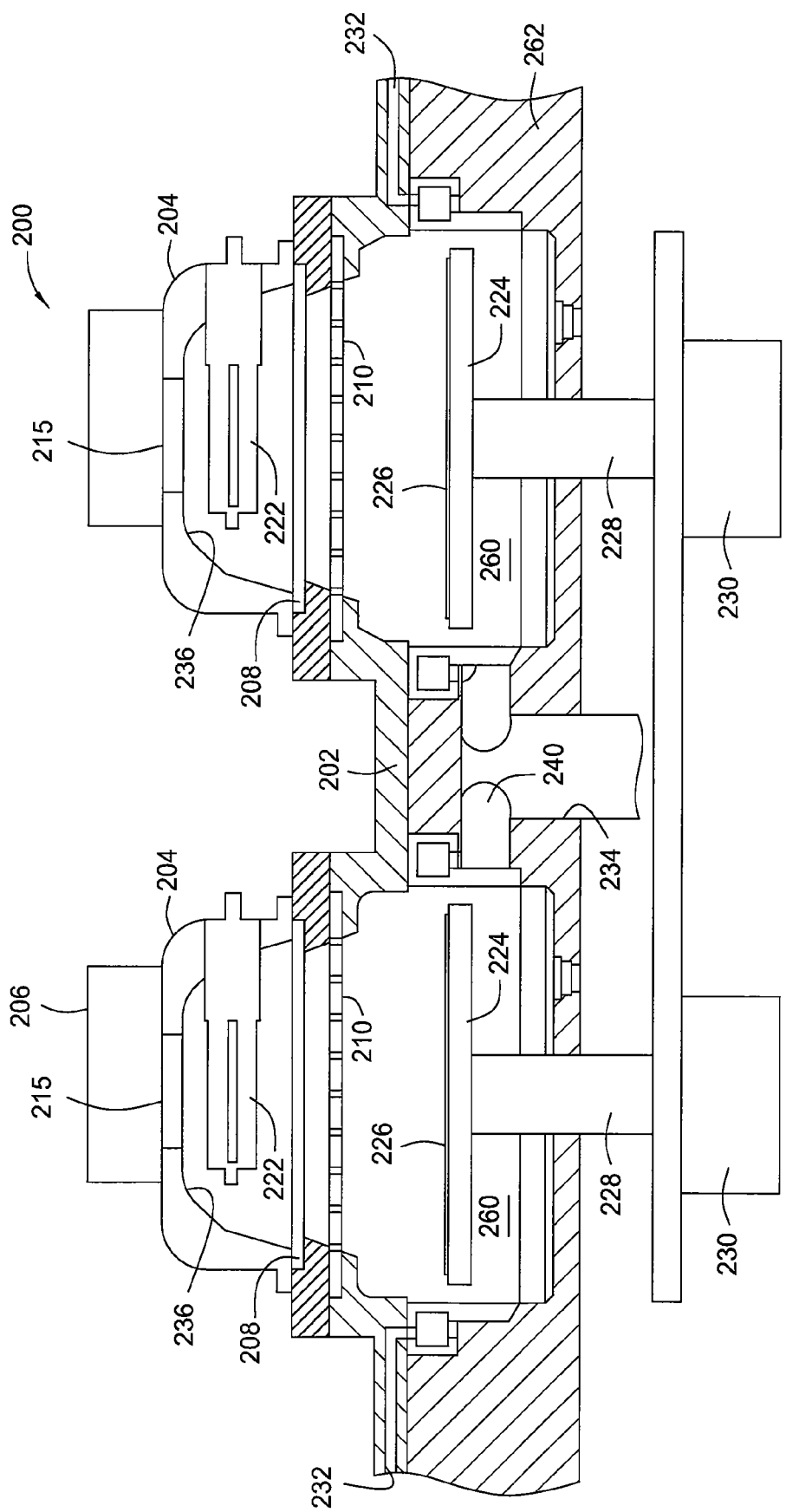
FIG. 2 illustrates a cross-sectional view of an exemplary tandem processing chamber that can be used for curing of an amorphous carbon layer according to embodiments of the invention.

FIG. 2 illustrates a cross-sectional view of an exemplary tandem processing chamber 200, which can be used for curing of an amorphous carbon layer according to embodiments described herein. The processing chamber 200 provides two separate and adjacent processing regions in a chamber body for processing the substrates. The processing chamber 200 generally has a lid 202, housings 204 and power sources 206. Each of the housings 204 cover a respective one of two UV lamp bulbs 222 disposed respectively above two processing regions 260 defined within the body 262. Each of the processing regions 260 includes a heating substrate support, such as substrate support 224, for supporting a substrate 226 within the processing regions 260, and a gas exhaust port 240. The UV lamp bulbs 222 emit UV light that is directed through the windows 208 and the gas distribution showerheads 210 onto each substrate located within each processing region. In one embodiment, the gas distribution showerhead 210 may be optional and is not required for the processing chamber 200. The substrate supports 224 can be made from ceramic or metal such as aluminum. The substrate supports 224 may couple to stems 228 that extend through a bottom of the body 262 and are operated by drive systems 230 to move the substrate supports 224 in the processing regions 260 toward and away from the UV lamp bulbs 222. The drive systems 230 can also rotate and/or translate the substrate supports 224 during curing to further enhance uniformity of substrate illumination. The exemplary tandem processing chamber 200 may be incorporated into a processing system, such as a processing system 100 shown in FIG. 1, or any other systems mentioned above with respect to FIG. 1.

The UV lamp bulbs 222 can be an array of light emitting diodes or bulbs utilizing any of the state of the art UV illumination sources including, but not limited to, microwave arcs, radio frequency filament (capacitively coupled plasma) and inductively coupled plasma (ICP) lamps. The UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV bulbs are a source of ultraviolet radiation, and may transmit a broad spectral range of wavelengths of UV and infrared (IR) radiation.

The UV lamp bulbs 222 may emit light across a broad band of wavelengths from 170 nm to 400 nm. The gases selected for use within the UV lamp bulbs 222 can determine the wavelengths emitted. UV light emitted from the UV lamp bulbs 222 enters the processing regions 260 by passing through windows 208 and gas distribution showerheads 210 disposed in apertures in the lid 202. The windows 208 may be made of an OH free synthetic quartz glass and have sufficient thickness to maintain vacuum without cracking. The windows 208 may be fused silica that transmits UV light down to approximately 150 nm. The gas distribution showerheads 210 may be made of transparent materials such as quartz or sapphire and positioned between the windows 208 and the substrate support 224. Since the lid 202 seals to the body 262 and the windows 208 are sealed to the lid 202, the processing regions 260 provide volumes capable of maintaining pressures from approximately 1 Torr to approximately 650 Torr. Processing or cleaning gases may enter the processing regions 260 via a respective one of two inlet passages 232. The processing or cleaning gases then exit the processing regions 260 via a common outlet port 234.

Each of the housings 204 includes an aperture 215 adjacent the power sources 206. The housings 204 may include an interior parabolic surface defined by a cast quartz lining 236 coated with a dichroic film. The dichroic film usually constitutes a periodic multilayer film composed of diverse dielectric materials having alternating high and low refractive index. Therefore, the quartz linings 236 may transmit infrared light and reflect UV light emitted from the UV lamp bulbs 222. The quartz linings 236 may adjust to better suit each process or task by moving and changing the shape of the interior parabolic surface. The processing chamber 200 is further described in the commonly assigned U.S. patent application Ser. No. 13/248,656 filed on Sep. 29, 2011 by Baluja et al., which is incorporated by reference in its entirety.

Exemplary Fabrication Sequence Incorporating a-C Layer as Hardmask

FIGS. 3A-3E illustrate schematic cross-sectional views of a substrate 300 at different stages of an integrated circuit fabrication sequence incorporating an a-C layer as a hardmask. The a-C layer may be deposited and cured using the processing system 100 and the processing chamber 200 discussed above with respect to FIGS. 1 and 2, respectively. A substrate structure 350 denotes the substrate 300 together with other material layers formed on the substrate 300. FIG. 3A illustrates a cross-sectional view of a substrate structure 350 having a material layer 302 that has been conventionally formed thereon. The material layer 302 may be a low-k material and/or an oxide, e.g., $SiO_2$.

FIG. 3B depicts an amorphous carbon layer 304 deposited on the substrate structure 350 of FIG. 2A. The amorphous carbon layer 304 is formed on the substrate structure 350 by conventional means, such as via PECVD. Depending on the etch chemistry of the energy sensitive resist material 308 used in the fabrication sequence, an optional capping layer (not shown) may be formed on amorphous carbon layer 304 prior to the formation of energy sensitive resist material 308. The optional capping layer functions as a mask for the amorphous carbon layer 304 when the pattern is transferred therein and protects amorphous carbon layer 304 from energy sensitive resist material 308.

As depicted in FIG. 3B, energy sensitive resist material 308 is formed on amorphous carbon layer 304. The layer of energy sensitive resist material 308 can be spin-coated on the substrate to a desired thickness. Most energy sensitive resist materials are sensitive to ultraviolet (UV) radiation having a wavelength less than about 450 nm, and for some applications having wavelengths of 245 nm or 193 nm.

A pattern is introduced into the layer of energy sensitive resist material 308 by exposing energy sensitive resist material 308 to UV radiation 330 through a patterning device, such as a mask 310, and subsequently developing energy sensitive resist material 308 in an appropriate developer. After energy sensitive resist material 308 has been developed, the desired pattern, consisting of openings 340, is present in energy sensitive resist material 308, as shown in FIG. 3C.

Thereafter, referring to FIG. 3D, the pattern defined in energy sensitive resist material 308 is transferred through amorphous carbon layer 304 using the energy sensitive resist material 308 as a mask. An appropriate chemical etchant is used that selectively etches amorphous carbon layer 304 over the energy sensitive resist material 308 and the material layer 302, extending openings 340 to the surface of material layer 302. Appropriate chemical etchants include ozone, oxygen or ammonia plasmas.

Referring to FIG. 3E, the pattern is then transferred through material layer 302 using the amorphous carbon layer 304 as a hardmask. In this process step, an etchant is used that selectively removes material layer 302 over amorphous carbon layer 304, such as a dry etch, i.e. a non-reactive plasma etch. After the material layer 302 is patterned, the amorphous carbon layer 304 can optionally be stripped from the substrate 300.

Exemplary Fabrication Process of a-C Hardmask

Figure 4:
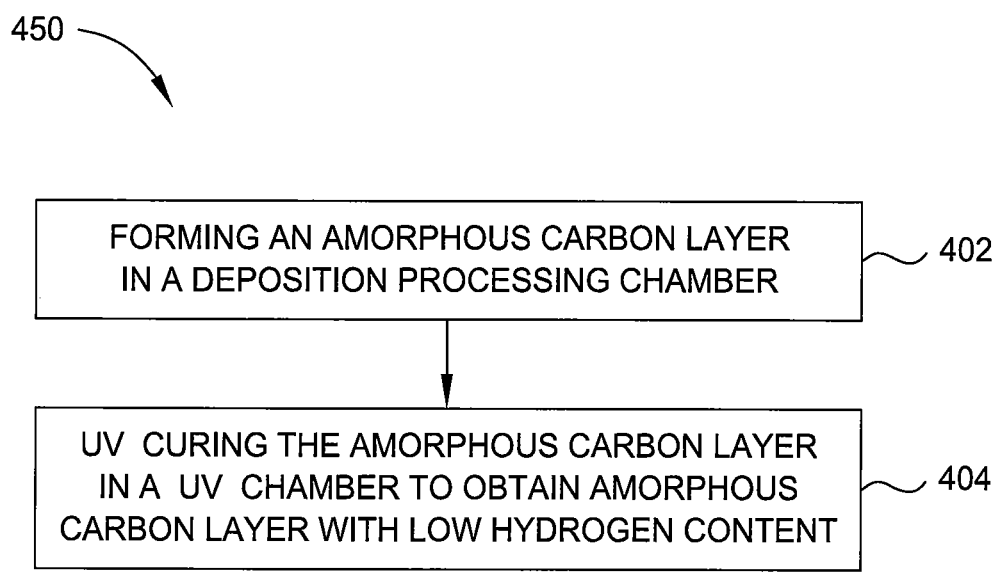
FIG. 4 illustrates an exemplary fabrication process for forming an amorphous carbon layer in accordance with embodiments of the present invention.

FIG. 4 illustrates an exemplary fabrication process 450 for forming an amorphous carbon layer in accordance with one embodiment of the present invention. The amorphous carbon layer formed by the process 450 can be used in replace of the amorphous carbon layer 304 as discussed above with respect to FIGS. 3B-3E. As stated previously, amorphous carbon is a material that may be used as an etch hardmask in semiconductor applications due to its high chemical inertness, optical transparency, and easy removal. Aspects of the invention described below have been proved by the present inventors to be able to create an amorphous carbon film with reduced compressive film stress, high film density, and therefore higher etch selectivity. High etch selectivity enables an even thinner hardmask which improves etch margin and allows for controllable etch of smaller features, thereby obtaining a superior line integrity for devices under sub 45 nm without having conventional issues associated with line wiggling and line bending. It should be noted that the sequence of steps illustrated in FIG. 4 are not intended to be limiting as to the scope of the invention described herein, since one or more steps may be added, deleted and/or reordered without deviating from the basic scope of the invention.

The process 450 starts with step 402 by depositing an amorphous carbon layer in a deposition processing chamber. The amorphous carbon layer may be formed by a process that includes introducing a hydrocarbon source, a diluent gas, and optionally, a plasma-initiating gas into a process chamber, such as the processing system 100 discussed above with respect to FIG. 1. In one embodiment, the amorphous carbon layer may be an Advanced Patterning Film™ (APF) material commercially available from Applied Materials, Inc. of Santa Clara, Calif. In one embodiment, the hydrocarbon source gas is a mixture of one or more hydrocarbon compounds, and, optionally a carrier gas, such as argon.

In one embodiment, the hydrocarbon compounds or derivatives thereof that may be included in the hydrocarbon source gas may be described by the formula $C_xH_y$, where x has a range of between 1 and 10 and y has a range of between 2 and 30. The hydrocarbon compounds may include, but is not limited to alkanes such as propane, methane, ethane, butane and its isomer isobutane, pentane and its isomers isopentane and neopentane, hexane and its isomers 2-methylpentance, 3-methylpentane, 2,3-dimethylbutane, and 2,2-dimethyl butane, and so on; alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; alkynes such as acetylene, propyne, butyne, vinylacetylene and derivatives thereof; aromatic such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like.

In one embodiment, the hydrocarbon compounds may be partially or completely doped derivatives of hydrocarbon compounds, including fluorine-, oxygen-, hydroxyl group-, and boron-containing derivatives of hydrocarbon compounds.

Suitable diluent gases may include, but are not limited to hydrogen ($H_2$), helium (He), argon (Ar), ammonia ($NH_3$), CO, $CO_2$, and combinations thereof. In one example, hydrogen gas is used as the diluent gas. Gases such as nitrogen ($N_2$), ammonia ($NH_3$), or combinations thereof, among others, may be added to the gas mixture, if desired. Ar, He, and $N_2$ may be used to control the density and deposition rate of the amorphous carbon layer. The addition of $N_2$ and/or $NH_3$ can be used to control the hydrogen ratio of the amorphous carbon layer.

In certain embodiments, the amorphous carbon layer deposition process includes the use of a plasma-initiating gas that is introduced into the chamber before, after, and/or at the same time as the hydrocarbon compound and a plasma is initiated to begin deposition. The plasma-initiating gas may be a high ionization potential gas including, but not limited to, helium gas, hydrogen gas, nitrogen gas, argon gas and combinations thereof. The plasma-initiating gas may also be a chemically inert gas, such as helium gas, nitrogen gas, argon gas, and combinations thereof. Suitable ionization potentials for gases are from about 5 eV (electron potential) to 25 eV. The plasma-initiating gas may be introduced into the chamber before the hydrocarbon source gas, which allows a stable plasma to be formed and reduces the chances of arcing. An inert gas, such as argon, may be used as a diluent gas and/or a carrier and may be introduced with the plasma-initiating gas, the hydrocarbon source, or combinations thereof.

In one embodiment, the hydrocarbon compound and the diluent gas may be introduced at a hydrocarbon compound to diluent gas flow ratio from about 1:3 or greater, for example, from about 1:32 to 1:3, such as from about 1:15 to about 1:8 for the amorphous carbon layer deposition. In one embodiment, the hydrocarbon compound and the diluent gas may be introduced at a hydrocarbon compound to diluent gas flow ratio from about 1:12 or greater, for example, from about 1:18 to about 1:14. In one embodiment, the hydrocarbon compound and the diluent gas may be introduced at a hydrocarbon compound to diluent gas flow ratio from about 1:15 or greater. In one embodiment, the hydrocarbon compound and the diluent gas may be introduced at a hydrocarbon compound to diluent gas flow ratio from about 1:32 to about 1:18. In one example, the diluents gas is hydrogen gas. Introducing a large quantity of diluent gas, for example hydrogen gas, into the deposition chamber relative to the quantity of hydrocarbon compound has been observed to be able to further enhance the removal of —H atoms from the amorphous carbon layer during growth. As the amorphous carbon layer has a lot of C—C bonds, C═C bonds, and C—H bonds, the hydrogen gas may serve as an etching gas during the amorphous carbon layer deposition. During the deposition, for example, the hydrogen breaks up and becomes hydrogen radicals which can attach to hydrogen loose bonds on the surface of the amorphous carbon layer and form hydrogen gas, thereby removing —H atoms from the amorphous carbon layer during growth.

In certain embodiments, the deposition process may be tuned in such a way that the deposition rate is not too fast (i.e., less than 2000 Å/min) to further lower the —H content in the amorphous carbon layer.

The amorphous carbon layer may be deposited from the process gas by maintaining a chamber pressure of about 0.5 Torr or greater, such as from about 0.5 Torr to about 20 Torr, and in one embodiment, about 6 Torr or greater, for example, from about 6 Torr to about 8 Torr. In one embodiment, the chamber pressure may be maintained from about 1 Torr to about 9 Torr, for example, about 3 Torr.

The amorphous carbon layer may be deposited from the hydrocarbon source gas and the diluent gas source in a chamber maintaining a substrate temperature from about 25° C. to about 800° C., such as at a temperature from about 200° C. to about 700° C. or at a temperature from about 300° C. to about 650° C., for example, from about 480° C. to about 650° C. Depositing an amorphous carbon layer at a high temperature ensures that the as-deposited layer has low amount of —H content and a good thermal stability to begin with. It has been also observed that depositing an amorphous carbon layer at increased temperatures yields better defect 'buring' capability due to enhanced diffusion of surface atoms, and a denser film which correspondingly improves the etch selectivity of the film. If desired, a lower substrate temperature from about 200° C. to about 300° C. may be used.

When depositing the amorphous carbon layer, an electrode spacing between the showerhead and substrate surface may be between about 100 mils and 5,000 mils spacing, for example, about 400 mils spacing.

In certain embodiments where plasma is used, the hydrocarbon source, the diluent gas source, and the plasma-initiating gas are introduced into the chamber and a plasma is initiated to begin deposition. A dual-frequency RF system may be used to generate the plasma. A dual frequency RF power application is believed to provide independent control of flux and ion energy, since it is believed that the energy of the ions hitting the film surface influences the film density. It is believed that the high frequency plasma controls plasma density and a low frequency plasma controls kinetic energy of the ions hitting the substrate surface. A dual-frequency source of mixed RF power provides a high frequency power in a range from about 10 MHz to about 30 MHz, for example, about 13.56 MHz, as well as a low frequency power in a range of from about 10 KHz to about 1 MHz, for example, about 350 KHz. When a dual frequency RF system is used to deposit an amorphous carbon layer, the ratio of the second RF power to the total mixed frequency power is preferably less than about 0.6 to 1.0 (0.6:1). The applied RF power and use of one or more frequencies may be varied based upon the substrate size and the equipment used. In certain embodiments, a single frequency RF power application may be used, and is typically, an application of the high frequency power as described herein.

Plasma may be generated by applying RF power at a power density to substrate surface area of from about 0.01 W/cm$^2$ to about 5 W/cm$^2$, such as from about 0.01 to about 2 W/cm$^2$, for example, about 1.55 W/cm$^2$. The power application may be from about 1 Watt to about 2,000 watts, such as from about 1,000 W to about 1,700 W, for example about 1,400 W for a 300 mm substrate. In certain embodiments, the power application may be from about 500 watts to about 600 watts.

An exemplary deposition process for depositing an amorphous carbon layer on a 300 mm circular substrate occurs at a high temperature and employs a plasma-initiating gas, such as argon, a hydrocarbon source, such as propylene ($C_3H_6$), and a diluent gas, such as hydrogen ($H_2$). The process includes supplying a plasma-initiating gas, such as argon, at a flow rate from about 0 sccm to about 50,000 sccm, for example, between about 0 sccm to about 8000 sccm, supplying a hydrocarbon source, such as propylene ($C_3H_6$), at a flow rate from about 100 sccm to about 50,000 sccm, for example, from about 600 sccm to about 3000 sccm, and supplying a diluent gas source, such as hydrogen ($H_2$), at a flow rate from about 10 sccm to about 20,000 sccm, for example, from about 200 sccm to about 8000 sccm, applying a dual frequency RF power (about 13.56 MHz) from about 10 W to about 2,000 W, for example, from about 500 W to 1800 W, maintaining a chamber pressure from about 0.5 Torr about 20 Torr, for example, from about 1 Torr to 15 Torr, and maintaining a substrate temperature above about 200° C., such as between about 480° C. to about 650° C. The flow rates of the hydrocarbon source gas and the diluent source gas may be adjusted to achieve a hydrocarbon compound to diluent gas flow ratio of from about 1:32 to 1:10. This process range provides a deposition rate for an amorphous carbon layer in the range of about 100 Å/min to about 5,000 Å/min. One skilled in the art, upon reading the disclosure herein, can calculate appropriate process parameters in order to produce the amorphous carbon layer of different deposition rates.

Another exemplary deposition process for depositing an amorphous carbon layer on a 300 mm circular substrate occurs at a low temperature and employs a plasma-initiating gas, such as argon, a hydrocarbon source, such as acetylene ($C_2H_2$), and a diluent gas, such as hydrogen ($H_2$). The process includes supplying a plasma-initiating gas, such as argon, at a flow rate from about 0 sccm to about 50,000 sccm, for example, between about 0 sccm to about 15,000 sccm, supplying a hydrocarbon source, such as acetylene ($C_2H_2$), at a flow rate from about 100 sccm to about 50,000 sccm, for example, between about 500 sccm to about 3000 sccm, and supplying a diluent gas source, such as hydrogen ($H_2$), at a flow rate from about 10 sccm to about 20,000 sccm, for example, between about 500 sccm to about 9000 sccm, applying a dual frequency RF power (about 13.56 MHz) from about 10 W to about 2,000 W, for example, from about 500 W to 1800 W, maintaining a chamber pressure from about 0.5 Torr about 20 Torr, for example, from about 1 Torr to 15 Torr, and maintaining a substrate temperature from about 200° C. to about 650° C. The flow rates of the hydrocarbon source gas and the diluent source gas may be adjusted to achieve a hydrocarbon compound to diluent gas flow ratio of from about 1:32 to 1:10. One skilled in the art, upon reading the disclosure herein, can calculate appropriate process parameters in order to produce the amorphous carbon layer of different deposition rates.

Example

The following non-limiting example is provided to further illustrate embodiments described herein regarding amorphous carbon deposition. However, the examples are not intended to be all inclusive and are not intended to limit the scope of the embodiments described herein.

A 2000 Å amorphous carbon layer was deposited on a substrate in the Producer® system. The amorphous carbon layer was deposited as follows: providing a flow rate of argon to the process chamber of about 1600 sccm, providing a flow rate of hydrogen ($H_2$) to the process chamber of about 4000 sccm, providing a flow rate of propylene ($C_3H_6$) to the process chamber of about 1000 sccm, applying a high frequency RF power (13.56 MHz) at a power density to substrate surface area of from about 500 W/cm² to about 1700 W/cm², maintaining a deposition temperature of about 575° C., maintaining a chamber pressure of about 11 Torr, with a spacing of about 350 mils, for a time period of about 100 seconds.

In step 404, after the amorphous carbon layer has been deposited on the substrate, the substrate is transferred to a UV chamber, such as the tandem processing chamber 200 discussed above with respect to FIG. 2, for UV curing of the amorphous carbon layer. The UV curing process may be performed in situ within the same processing system, for example, transferred from the processing chamber 125 discussed above with respect to FIG. 1 to the tandem processing chamber 200 in the system without break in a vacuum. Treating the deposited amorphous carbon layer with the UV curing process has shown a significantly improved reduction in —H content since UV radiation breaks more C:C chains (to produce shorter ones) and breaks more C:H bonds in the deposited amorphous carbon layer, and changes the bonding hybridization of the carbon atoms and the relative concentration of the different bonds from $sp^3$-hybridized cluster (highly disordered structure, compressive stress region) to $sp^2$-hybridized cluster (ordered structure, stress-free/slight tensile region). Therefore, the film density of the amorphous carbon layer is increased, which in turn leads to a higher etch selectivity for hardmask films.

In one embodiment, the substrate with amorphous carbon deposited thereon is exposed to UV radiation at a UV power of about 1,000 milliWatts/cm² to about 1,500 milliWatts/cm², for example, between about 500 milliWatts/cm² and about 1,350 milliWatts/cm². In one example, the deposited amorphous carbon layer may be exposed to the UV radiation for between about 10 seconds and about 600 seconds, such as between about 300 seconds and about 900 seconds. The UV radiation may include a range of UV wavelengths and include one or more simultaneous wavelengths. Suitable UV wavelengths include between about 1 nm and about 400 nm, and may further include optical wavelengths up to about 600 or 780 nm. In one example, UV wavelengths include between about 100 nm and about 350 nm. The UV radiation application may occur at multiple wavelengths, a tunable wavelength emission and tunable power emission, or a modulation between a plurality of wavelengths as desired, and may be emitted from a single UV lamp or applied from an array of UV lamps.

During the UV curing processing, the temperature of the processing chamber may be maintained above 200° C., such as between about 450° C. and about 650° C. at a chamber pressure between vacuum, for example, less than about 1 mTorr up to about atmospheric pressure, i.e., 760 Torr, for example at about 100 Torr. The source of UV radiation may be between about 100 mils and about 600 mils from the substrate surface. Optionally, a processing gas may be introduced during the UV curing process. Suitable processing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_XH_Y$, $C_XF_Y$, $C_XF_YH_Z$, or combinations thereof, with x being an integer between 1 and 6, y being an integer between 4 and 14, and z being an integer between 1 and 3.

Example

The following non-limiting example is provided to further illustrate embodiments described herein regarding UV curing of amorphous carbon layer. However, the examples are not intended to be all inclusive and are not intended to limit the scope of the embodiments described herein.

A substrate having an amorphous carbon layer deposited in a manner as described in step 402 is exposed to UV radiation at a chamber temperature of about 550° C. and applied power of about 1,350 milliWatts/cm² at a wavelength of about 400 nm for about 900 seconds. The UV curing may be conducted in an Argon and Helium atmosphere with an Ar flow of about 16,000 sccm, He flow of about 16000 sccm and pressure of 6 torr. After UV curing, the amorphous carbon layer exhibits —H content less than about 20% and an increased film density up to 1.98 g/cc.

Figure 5:
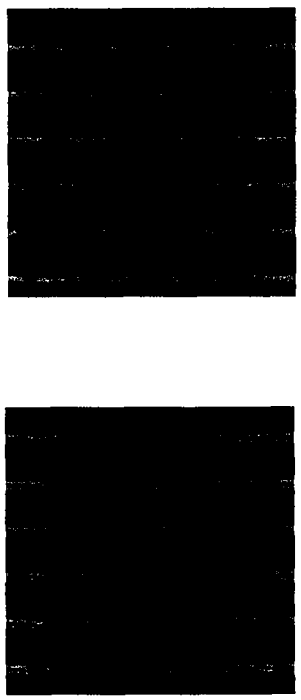
FIG. 5 depicts scanning electron microscope images illustrating a comparison of the patterning performance comparison for an amorphous carbon layer formed according to embodiments described herein versus a conventional amorphous carbon film.
Figure 5:
Figure 5:
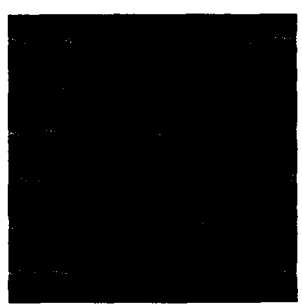
Figure 5:

FIG. 5 depicts scanning electron microscope images illustrating a comparison of the patterning performance comparison for an amorphous carbon layer "A" formed according to embodiments described herein versus a conventional amorphous carbon film "B" (e.g., APF 550, commercially available from Applied Materials, Inc. of Santa Clara, Calif.). Table I provides a comparison of the film properties for the amorphous carbon layer formed according to embodiments described herein versus APF 550. The results depicted in Table I demonstrate that while providing many of the similar properties as the APF 550 film such as optical properties and film density, the amorphous carbon layer formed according to embodiments described herein exhibits excellent patterning performance 2× and beyond and line bending control (e.g., with reduced LER by 20%) at a critical dimension of 20 nm or even 15 nm, as compared to the conventional amorphous carbon film APF 550 (see FIG. 5).

TABLE I

|   | a: C layer formed according to embodiments of the invention | APF550 |
|---|---|---|
| Thinkness(Å) | 1969 | 2002 |
| Line Edge Roughness (LER) | 2.2 nm | 2.6 nm |
| RI (248 nm) | 1.4975 | 1.4738 |
| RI (633 nm) | 1.8673 | 1.8757 |
| k (248 nm) | 0.6281 | 0.6745 |
| k (633 nm) | 0.3548 | 0.3985 |
| Dep. Rate | 2528 | 2487 |
| Stress (MPa) | 70 | 142 |
| Density (g/cc) | 1.50 | 1.46 |

Embodiments of the invention described above allow for forming an amorphous carbon film with low hydrogen content, reduced compressive film stress and high film density by depositing the amorphous carbon layer at a high temperature and a slower deposition rate, followed by a high temperature, low pressure UV curing process such that the deposited film is highly carbon rich with less than 20% —H content present. UV curing of amorphous carbon layer to obtain lower H content in the deposited film as proposed by the invention is opposed to ion bombardment or doping approach as typically used in the industry to extract hydrogen from the film, which increases the compressive stress in the deposited film. The increased density of amorphous carbon film results in a higher etch selectivity for hardmask films, thereby providing good line edge roughness, line width roughness, and space width roughness without line wiggling and bending issues as would normally be seen for sub 45 nm devices using conventional amorphous carbon hardmasks.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
   introducing a gas mixture comprising a hydrocarbon source and a diluent gas into a deposition chamber located within a processing system;
   generating a plasma from the gas mixture in the deposition chamber at a temperature between about 200° C. and about 700° C. to form a low-hydrogen content amorphous carbon layer on the substrate;
   transferring the substrate into a curing chamber located within the processing system without breaking vacuum; and
   exposing the substrate to UV radiation within the curing chamber at a curing temperature above about 200° C.

2. The method of claim 1, wherein the amorphous carbon layer is deposited at a deposition rate less than 2000 Å/min.

3. The method of claim 1, wherein the amorphous carbon layer is deposited at a temperature of about 480° C. to about 650° C.

4. The method of claim 1, wherein the substrate is exposed to UV radiation at a chamber pressure of about 1 Torr to about 9 Torr.

5. The method of claim 1, wherein the substrate is exposed to UV radiation at a UV power of about 1,000 milliWatts/cm$^2$ to about 1,500 milliWatts/cm$^2$.

6. The method of claim 1, wherein the hydrocarbon source and the diluent gas are introduced into the deposition chamber at a hydrocarbon source to diluent gas flow ratio from about 1:32 to about 1:18.

7. The method of claim 1, wherein the amorphous carbon layer has a hydrogen content less than about 20%.

8. The method of claim 1, wherein the diluents gas comprises hydrogen ($H_2$), helium (He), argon (Ar), ammonia ($NH_3$), CO, $CO_2$, or combinations thereof.

9. The method of claim 1, wherein the hydrocarbon source gas is selected from the group consisting of acetylene ($C_2H_2$), propylene ($C_3H_6$), propyne ($C_3H_4$), propane ($C_3H_8$), butane ($C_4H_{10}$), butylene ($C_4H_8$), butadiene ($C_4H_6$), vinylacetylene, and combinations thereof.

10. The method of claim 1, wherein the substrate is exposed to UV radiation at a temperature of about 450° C. to about 650° C.

11. A method of forming a semiconductor device, comprising:
   forming an amorphous carbon layer on a substrate in a deposition chamber located within a processing system by:
      introducing a gas mixture comprising a hydrocarbon source and a diluent gas into the deposition chamber; and
      generating a plasma from the gas mixture in the deposition chamber at a temperature between about 200° C. and about 700° C. to form a low-hydrogen content amorphous carbon layer on the substrate;
   transferring the substrate into a curing chamber located within the processing system without breaking vacuum;
   exposing the amorphous carbon layer formed on the substrate to UV radiation within the curing chamber at a curing temperature above about 200° C.;
   defining a pattern in at least one region of the amorphous carbon layer; and
   transferring the pattern defined in the at least one region of the amorphous carbon layer into the substrate using the amorphous carbon layer as a mask.

12. The method of claim 10, wherein the amorphous carbon layer is deposited at a deposition rate less than 2000 Å/min.

13. The method of claim 10, wherein the amorphous carbon layer is deposited at a temperature of about 480° C. to about 650° C.

14. The method of claim 10, wherein the substrate is exposed to UV radiation at a chamber pressure of about 1 Torr to about 9 Torr.

15. The method of claim 10, wherein the substrate is exposed to UV radiation at a UV power of about 1000 milliWatts/cm$^2$ to about 1,500 milliWatts/cm$^2$.

16. The method of claim 10, wherein the hydrocarbon source and the diluent gas are introduced into the deposition chamber at a hydrocarbon source to diluent gas flow ratio from about 1:32 to about 1:18.

17. The method of claim 10, wherein the amorphous carbon layer has a hydrogen content less than about 20%.

18. The method of claim 10, wherein the diluents gas comprises hydrogen ($H_2$), helium (He), argon (Ar), ammonia ($NH_3$), CO, $CO_2$, or combinations thereof.

19. The method of claim 10, wherein the hydrocarbon source gas is selected from the group consisting of acetylene ($C_2H_2$), propylene ($C_3H_6$), propyne ($C_3H_4$), propane ($C_3H_8$), butane ($C_4H_{10}$), butylene ($C_4H_8$), butadiene ($C_4H_6$), vinylacetylene, and combinations thereof.

20. The method of claim 10, wherein the substrate is exposed to UV radiation at a temperature of about 450° C. to about 650° C.

* * * * *